(12) United States Patent
Yu

(10) Patent No.: US 12,206,975 B2
(45) Date of Patent: Jan. 21, 2025

(54) CONNECTING ASSEMBLY, CAMERA MODULE, AND ELECTRONIC DEVICE

(71) Applicant: TRIPLE WIN TECHNOLOGY(SHENZHEN) CO. LTD., Shenzhen (CN)

(72) Inventor: Fei-Fan Yu, Shenzhen (CN)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 176 days.

(21) Appl. No.: 18/072,585

(22) Filed: Nov. 30, 2022

(65) Prior Publication Data

US 2024/0089576 A1    Mar. 14, 2024

(30) Foreign Application Priority Data

Sep. 9, 2022    (CN) .......................... 202211106070.6

(51) Int. Cl.
*H04N 23/57*    (2023.01)
*H01L 21/02*    (2006.01)
(Continued)

(52) U.S. Cl.
CPC ............. *H04N 23/57* (2023.01); *H04N 23/51* (2023.01); *H05K 1/09* (2013.01); *H05K 1/189* (2013.01); *H05K 2201/0338* (2013.01)

(58) Field of Classification Search
CPC ........ H04N 23/57; H04N 23/51; H04N 23/52; H04N 23/55; H05K 1/09; H05K 1/189; H05K 2201/0338; H05K 2201/05; H05K 2201/023; H05K 1/118; H05K 1/147; H05K 1/148; H05K 3/361; H05K 3/321; H05K 3/323; H05K 9/0094; H05K 3/32; H05K 3/325; H05K 1/0278; H05K 2201/2054; H05K 1/181; H01L 23/4828; H01L 23/5328; H01L 2021/60277; H01R 4/04

See application file for complete search history.

(56) References Cited

U.S. PATENT DOCUMENTS

| | | | |
|---|---|---|---|
| 11,994,701 B2 * | 5/2024 | Hsu ........................ | H04N 23/52 |
| 2002/0135727 A1 * | 9/2002 | Nakaminami .......... | H01R 4/04 |
| | | | 349/149 |

(Continued)

FOREIGN PATENT DOCUMENTS

| | | | | |
|---|---|---|---|---|
| CN | 104007866 A | * | 8/2014 | ............. G06F 3/041 |
| TW | I492357 | | 7/2015 | |

*Primary Examiner* — Marly S Camargo
(74) *Attorney, Agent, or Firm* — ScienBiziP, P.C.

(57) ABSTRACT

A connecting assembly comprises a substrate, a layer of conductive adhesive with conductive particles, a connection board, and a light transmission component. The connection board and the light transmission component are both glued to the substrate by the layer of conductive adhesive therebetween, and an operator can observe the a degree of deformation of the conductive particles in the layer of conductive adhesive to determine whether a conductive connection between the light transmission component and the substrate is affected. The connecting assembly allows an operator to effectively observe conductivity of every product in a nondestructive manner. A camera module comprising the connecting assembly and an electronic device are also disclosed.

17 Claims, 10 Drawing Sheets

(51) Int. Cl.
      *H01L 23/48*    (2006.01)
      *H01R 4/04*    (2006.01)
      *H04N 23/51*    (2023.01)
      *H04N 23/55*    (2023.01)
      *H05K 1/09*    (2006.01)
      *H05K 1/18*    (2006.01)

(56) References Cited

U.S. PATENT DOCUMENTS

| | | | | |
|---|---|---|---|---|
| 2011/0169022 | A1* | 7/2011 | Shiota | G02F 1/13452 257/88 |
| 2012/0212888 | A1* | 8/2012 | Wu | H01L 24/32 361/679.01 |
| 2014/0320764 | A1* | 10/2014 | Sah | G06F 1/1643 349/12 |
| 2016/0205781 | A1* | 7/2016 | Chan | G06F 1/13265 361/749 |
| 2018/0198013 | A1* | 7/2018 | Toya | H05K 1/09 |
| 2019/0288022 | A1* | 9/2019 | Hsu | H04N 23/57 |
| 2024/0214681 | A1* | 6/2024 | Xia | H04N 23/57 |

* cited by examiner

CONNECTING ASSEMBLY, CAMERA MODULE, AND ELECTRONIC DEVICE

CROSS-REFERENCE TO RELATED APPLICATION

This application claims priority to China Application No. 202211106070.6, having a filing date of Sep. 9, 2022, filed in China State Intellectual Property Administration, the entire contents of which are hereby incorporate by reference.

FIELD

The subject matter relates to printed circuit board connection technology, and more particularly to a connecting assembly, a camera module comprising the connecting assembly, and an electronic device comprising the camera module.

BACKGROUND

In providing a conductive connection between two printed circuit boards (PCBs) during production of an electronic device, such as a computer, an electronic book, or a camera module, operators need to glue two PCBs together by a layer of conductive adhesive. Generally, a conductivity test of the conductive connection is performed in a destructive manner, and such tests cannot be applied to all the products, thus the possibility of defects in some of the products remains.

SUMMARY

An objective of the present disclosure is achieved by providing a connecting assembly comprising a substrate, a connection board, a layer of conductive adhesive, and a light transmission component. The layer of conductive adhesive adhered to the substrate. The connection board and the light transmission component are parallel to the substrate. The light transmission component and the connection board are connected to the substrate by the layer of conductive adhesive adhered to the substrate, the layer of conductive adhesive comprises multiple conductive particles. Both the connection board and the substrate are in contact with the conductive particles for establishing electric conductive connection between the connection board and the substrate. The light transmission component is configured for transmitting light, the light enters the layer of conductive adhesive via the light transmission component, the conductive particles in the layer of conductive adhesive can be observed by an operator, according to a state of the conductive particles, such as a degree of deformation of the conductive particles, the operator can determine whether a conductive connection is established between the light transmission component and the substrate in a nondestructive manner.

According to a further embodiment, the light transmission component and the connection board are in a same plane.

According to a further embodiment, the light transmission component is connected to the connection board at peripheries of the connection board.

According to a further embodiment, the light transmission component is arranged in a middle part of the connection board.

According to a further embodiment, a cross-sectional area of the light transmission component is a polygon, a circle, or an oval, viewed in a direction perpendicular to the connection board.

According to a further embodiment, the connection board and the light transmission component are parallel to each other.

According to a second respect of the disclosure, a camera module is provided. The camera module comprises a connecting assembly above-mentioned, a carrier, and a flexible printed circuit board (FPC). The substrate of the connecting assembly is mounted on the carrier, the connection board of the connecting assembly is mounted on the FPC, and the FPC comprises a light transmission area configured for transmitting light into the light transmission component of the connecting assembly.

According to a further embodiment, the carrier is arranged with multiple first positioning marks, the FPC is arranged with multiple second positioning marks corresponding to the multiple first positioning marks, the FPC can be accurately aligned relative to the carrier by aligning the multiple first positioning marks with the multiple second positioning marks.

According to a further embodiment, the FPC is arranged with multiple light transmission rings, each light transmission ring encircles a corresponding one of the multiple second positioning marks.

According to a third respect of the disclosure, an electronic device comprising the camera module above-mentioned is provided.

BRIEF DESCRIPTION OF THE DRAWINGS

Implementations of the present technology will now be described, by way of example only, with reference to the attached figures.

DETAILED DESCRIPTION

Figure 1:
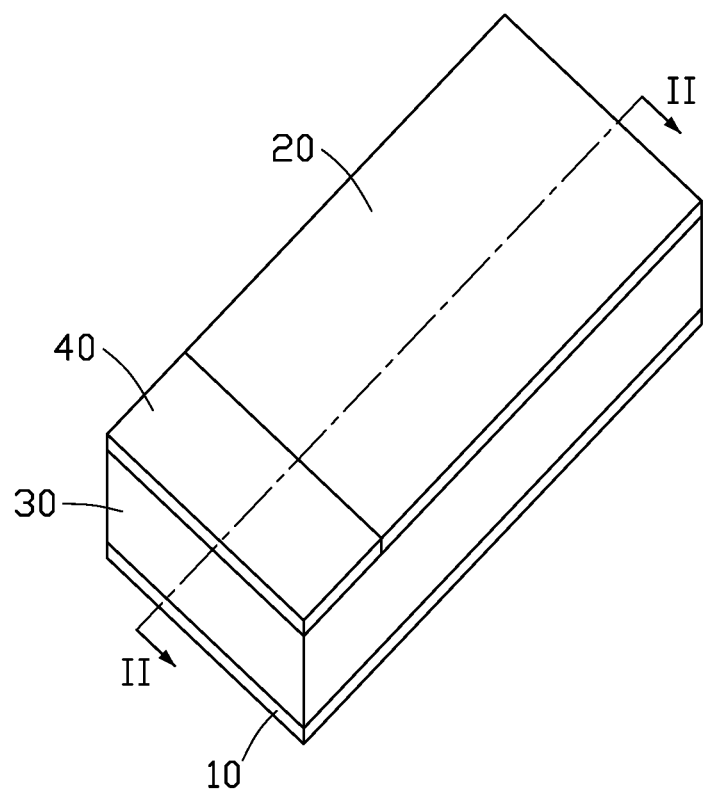
FIG. 1 is a perspective view of a connecting assembly according to a first embodiment of the present disclosure.

It will be appreciated that for simplicity and clarity of illustration, where appropriate, reference numerals have been repeated among the different figures to indicate corresponding or analogous components. The description is not to be considered as limiting the scope of the embodiments described herein. The drawings are not necessarily to scale and the proportions of certain parts may be exaggerated to better illustrate details and features of the present disclosure.

It should be understood that, the terms "first" and "second" are used to distinguish between elements and are not used to denote a particular order or imply a number of technical features, therefore, unless specifically defined, features described as "first" and "second" may expressly or implicitly include one or more of the stated features. In the description of the present application, "plurality" means "two or more", unless otherwise expressly and specifically defined.

In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described.

The term "comprising," when utilized, means "including, but not necessarily limited to"; it specifically indicates open-ended inclusion or membership in the so-described combination, group, series, and the like.

A description of the hereinafter described embodiments of the disclosure is presented herein with reference to the figures by way of exemplification and not as limitation.

Embodiment 1

Figure 2:
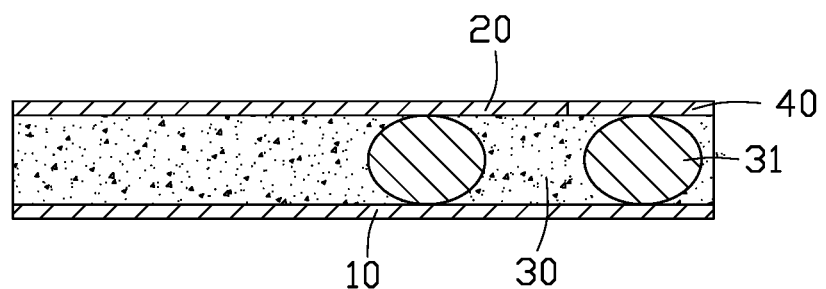
FIG. 2 is a cross section view along line II-II of FIG. 1.

Referring to FIG. 1 and FIG. 2, a connecting assembly 100 is provided, the connecting assembly 100 includes a substrate 10, a connection board 20, a layer of conductive adhesive 30, and a light transmission component 40. The light transmission component 40 is connected to the connection board 20 and is on the same plane as the connection board 20. In this embodiment, the connection board 20 is a rectangular board, and the light transmission component 40 is connected to the connection board 20 at periphery of the connection board 20. Specifically, the light transmission component 40 is connected to the connection board 20 at one side of the connection board 20, or the connecting assembly 100 can include two light transmission components 40, the two light transmission components 40 being arranged oppositely along a length or width direction of the connection board 20 and are connected to the connection board 20. The light transmission component 40 is configured for transmitting light, the light enters the layer of conductive adhesive 30 via the light transmission component 40, then the light is reflected by conductive particles in the conductive adhesive 30 back to the light transmission component 40, the light is visible light or infrared light, the light transmission component 40 is a transmitting sheet made of polyimide.

Specifically, the conductive adhesive 30 is anisotropic, and the conductive adhesive 30 includes multiple conductive particles 31 of the same size. Normally, the conductive particles 31 are distributed evenly in the conductive adhesive 30. The conductive adhesive 30 bonds two objects together and provides electrical conductivity by doing so.

A process of joining the substrate 10 and the connection board 20 is as follows: the conductive adhesive 30 is adhered to the substrate 10, the connection board together with the light transmission component 40 connected are adhered to the conductive adhesive 30, then the connection board 20 and the light transmission component 40 are adhered to the substrate 10 through the conductive adhesive 30. The conductive particles 31 in the conductive adhesive are pressed and flattened into a flattened pie-shape. The pie-shape indicates that the connection board 20 and the substrate 10 are both in contact with the conductive particles 31, therefore a conductive connection is effected between the connection board 20 and the substrate 10, and a current path exists between the connection board 20, the conductive particles 31, and the substrate 10.

A conductivity test is performed according to following principles: the pressed or unpressed state of the conductive particles 31, between the connection board and the substrate 10, is the same state as the conductive particles 31 between the light transmission component 40 and the substrate 10, as the light transmission component 40 and the connection board 20 are connected and located in the same plane. Therefore, an operator can observe the conductive particles 31 between the light transmission component 40 and the substrate 10 through the light transmission component 40, to determine whether the conductive particles 31 between the connection board 20 and the substrate 10 are in a pressed or unpressed state. As a current path between the connection board 20 and the substrate 10 is formed only in the pressed state, the operator can determine whether the current path between the connection board 20 and the substrate 10 is established by the state of the conductive particles 31.

In particular, microscopic observation by an operator of the connecting assembly 100 can easily be done, the light transmission component 40 allows light to go through, and the operator can observe state of the conductive particles 31, measure sizes of the conductive particles 31, and determine whether the conductive particles 31 are pressed and thus whether a conductive connection is effected between the connection board 20 and the substrate 10. If the conductive particles 31 between the light transmission component 40 and the substrate 10 are pressed, the conductive particles 31 between the connection board 20 and the substrate 10 will be pressed, and conductivity will be effected between the connection board 20 and the substrate 10; if the conductive particles 31 between the light transmission component 40 and the substrate 10 are not pressed, the conductive particles 31 between the connection board 20 and the substrate 10 will not be pressed, and reliable conductivity will not be effected between the connection board 20 and the substrate 10.

Therefore, the conductive particles 31 can be observed by the operator through the light transmission component 40, and a conductivity between the connection board 20 and the substrate 10 can be determined, avoiding a destructive test. Compared to the destructive test, the conductivity test of the embodiment is simple and convenient, such test allows the operator to test all the products, and ensures that any defective products are rejected.

Embodiment 2

Figure 3:
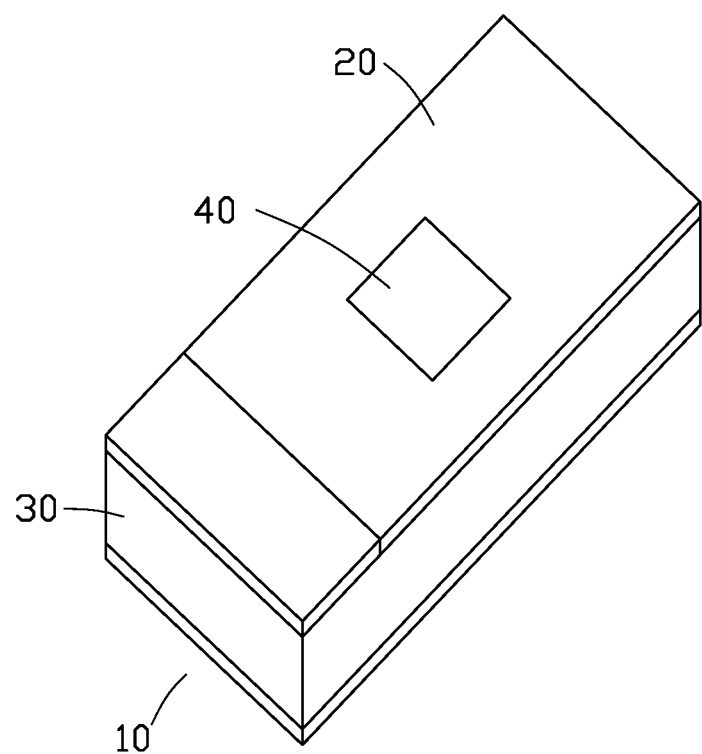
FIG. 3 is a perspective view of a connecting assembly according to a second embodiment of the present disclosure.

Referring to FIG. 3, a connecting assembly 200 of a second embodiment is provided, the configuration of the connecting assembly 200 of the second embodiment is same as that of the first embodiment, except that the light transmission component 40 is arranged at a middle part of the connection board 20, and the light transmission component 40 can have any cross-sectional shape in a direction perpendicular to the connection board 20, such as rectangle, polygon, circle, oval, or any other suitable shape.

Embodiment 3

Figure 4:
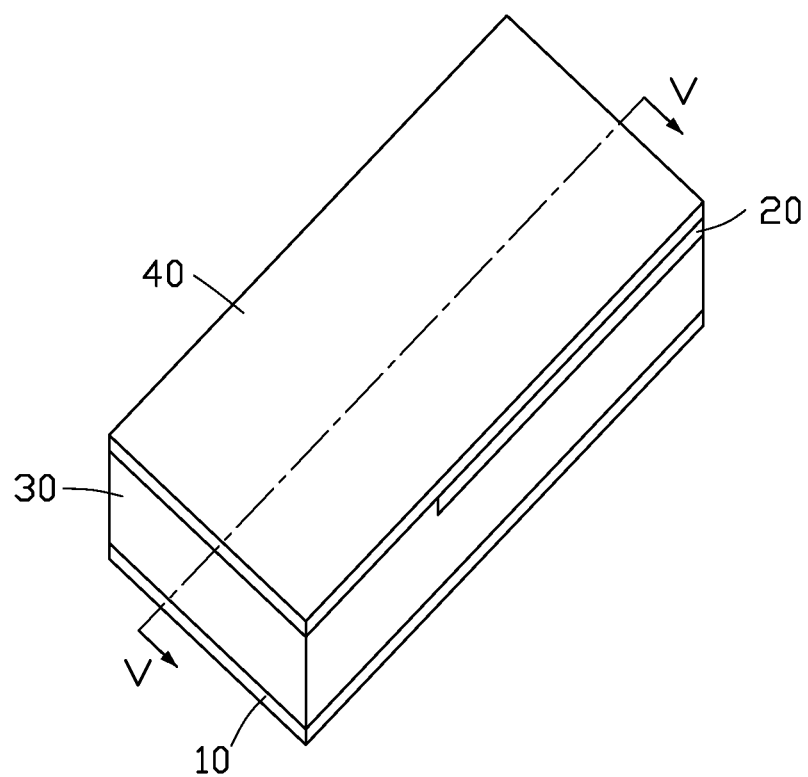
FIG. 4 is a perspective view of a connecting assembly according to a third embodiment of the present disclosure.
Figure 5:
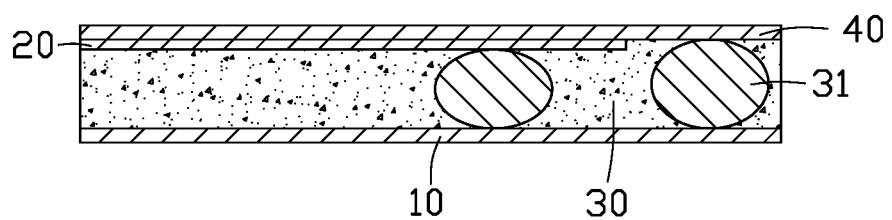
FIG. 5 is a cross section view along line V-V of FIG. 4.

Referring to FIG. 4 and FIG. 5, a connecting assembly 300 of a second embodiment is provided, the configuration of the connecting assembly 300 of the second embodiment is same as that of the first embodiment, except that the light transmission component 40 is a rectangular board having a contour same as that of the substrate 10, and the connection board 20 is a rectangular board having a length/width smaller than that of the light transmission component 40. The connection board 20 is glued to the substrate 10 via the conductive adhesive 30, the light transmission component 40 is glued to the substrate 10 via the conductive adhesive 30, and the light transmission component is arranged on a side of the connection board 20 away from the substrate 10. Thus a thickness of the layer of conductive adhesive 30 between the connection board 20 and the substrate 10 is greater than that between the light transmission component 40 and the substrate 10. In practice, the connection board 20 can be glued to the substrate 10 with one side flush with one side of the substrate 10, or the connection board 20 can be glued to the substrate 10 at a middle part of the substrate 10.

In this embodiment, the layer of conductive adhesive 30 between the connection board 20 and the substrate 10 is thicker than that between the light transmission component 40 and the substrate 10, then the conductive particles 31 between the connection board 20 and the substrate 10 are pressed harder than those between the light transmission component 40 and the substrate 10. The operator can observe the conductive particles 31 between the light transmission component 40 and the substrate 10, when the conductive particles 31 between the light transmission component and the substrate 10 are pressed so as to have a deformation satisfying at least a standard deformation, the conductive particles 31 between the connection board 20 and the substrate 10 are pressed into a deformation greater than the standard deformation, which indicates that a good conductive connection between the connection board 20 and the substrate 10 and a current path is formed by the connection board 20 and the substrate 10.

Embodiment 4

Figure 6:
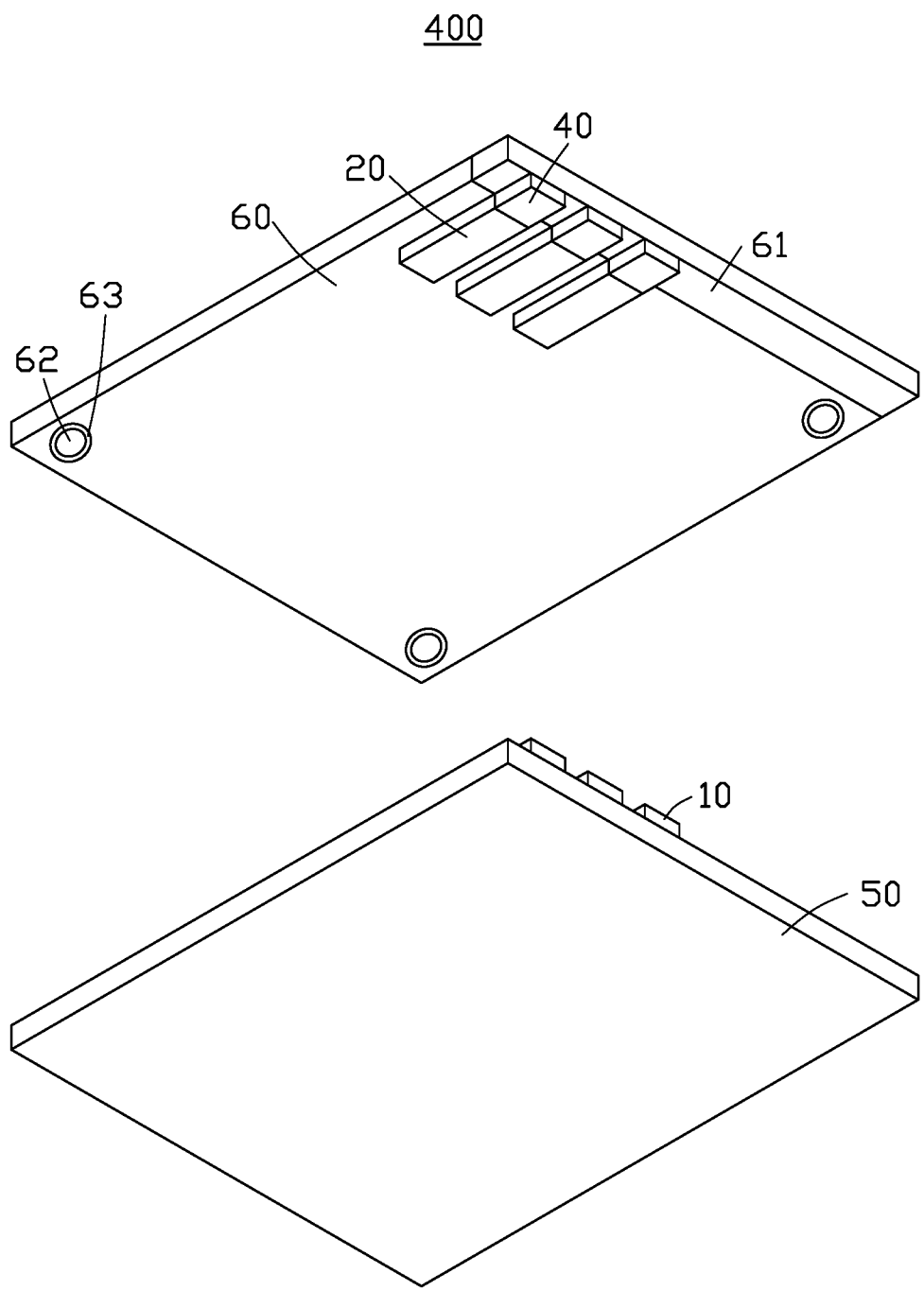
FIG. 6 is an exploded view of a camera module according to a fourth embodiment of the present disclosure.
Figure 7:
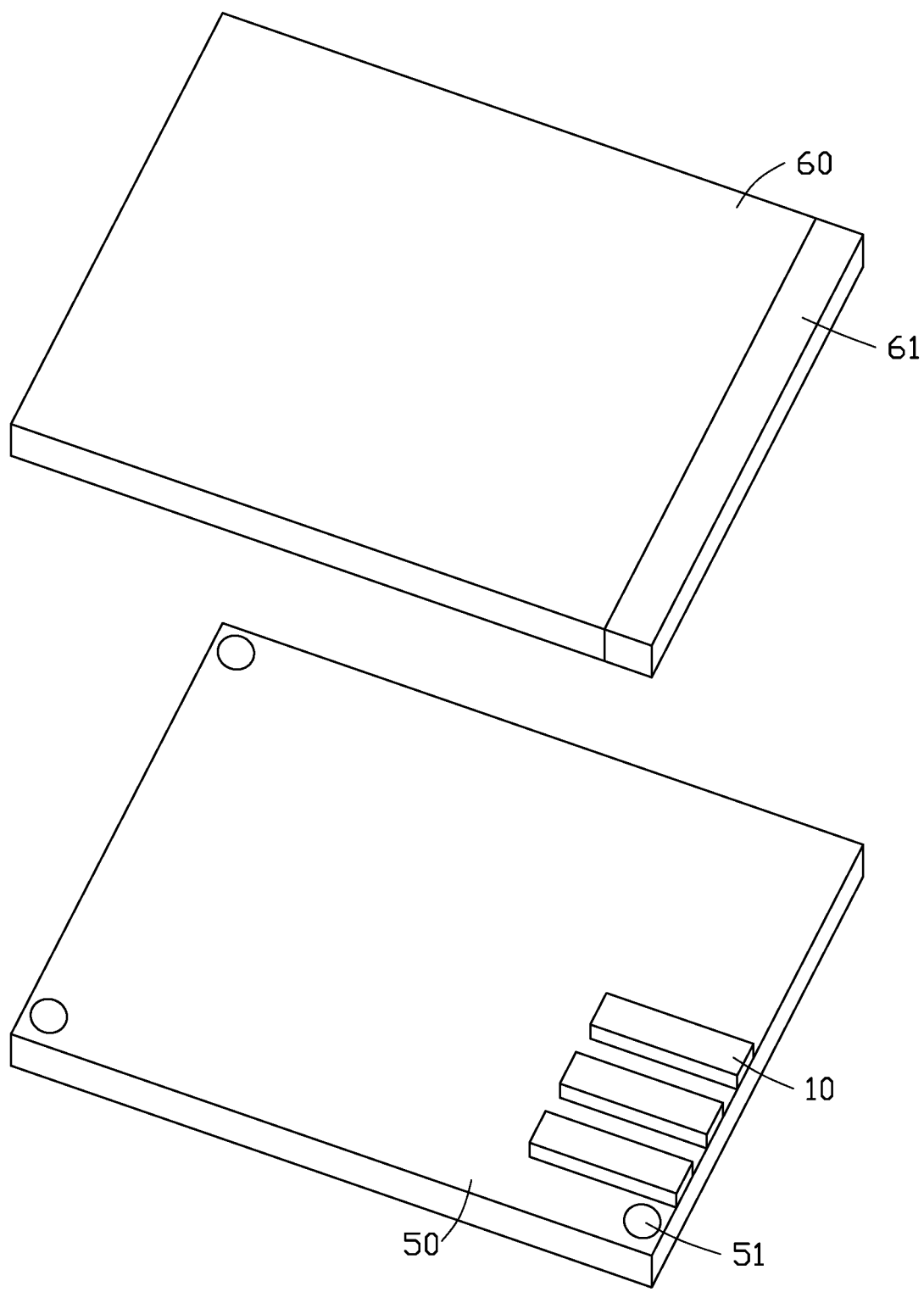
FIG. 7 is another exploded view of the camera module in FIG. 6.

Referring to FIG. 6 and FIG. 7, a camera module 400 is provided. The camera module 400 includes a carrier 50, a flexible circuit board (FPC) 60, and the connecting assembly 10 of the first embodiment. The substrate 10 is arranged on the carrier 50 at a side towards the FPC 60, and the substrate 10 is positioned near periphery of the carrier 50. The connection board 20 and the light transmission component 40 are arranged on the FPC 60 at a side towards the carrier 50, and the connection board 20 is positioned to correspond to the substrate 10. The FPC 60 is provided with a light transmission area 61, the light transmission area 61 is located corresponding to the light transmission component 40, allowing light to go through light transmission component 40 and the light transmission area 61.

In this embodiment, the light transmission area 61 is arranged near a periphery of the FPC 60, the light transmission component 40 is connected to the connection board 20 and is located in the same plane as the connection board 20, and the connection board 20 is arranged on the FPC 60 with the light transmission component 40 arranged on the light transmission area 61.

Further, the carrier 50 is arranged with multiple first positioning marks 51, the FPC 60 is arranged with multiple second positioning marks 62 corresponding to the multiple first positioning marks 51, and the first positioning marks 51 and the second positioning marks 62 are made of copper foil. In this embodiment, the first positioning marks 51 and the second positioning marks 62 are round in shape, and each first positioning mark 51 has a larger diameter than a corresponding second positioning mark 62. Further, the FPC 60 is arranged with multiple light transmission rings 63, each light transmission ring 63 is arranged to encircle one second positioning mark 62.

Therefore, when the FPC 60 is disposed on the carrier 50, alignment of the first positioning marks 51 and the second positioning marks 62 accurately positions the FPC 60 on the carrier 50. The operator can observe a relative position between each first positioning mark 51 and a corresponding second positioning mark 62 through a corresponding light transmission ring 63, then a relative position between the FPC 60 and the carrier 50 can be controlled, and the FPC 60 can be positioned accurately relative to the carrier 50, then the FPC 60 can be pressed against the carrier 50, the substrate 10 and the connection board 20 are glued together via the conductive adhesive 30, and a conductive connection between the substrate 10 and the connection board 20 is achieved.

In further embodiments, the camera module 400 can be arranged with the connecting assembly 200 of the second embodiment or the connecting assembly 300 of the third embodiment. The first positioning marks 51 and the second positioning marks 62 can have other shapes as long as the first positioning marks 51 and the second positioning marks 62 can be aligned correspondingly.

Embodiment 5

Figure 8:
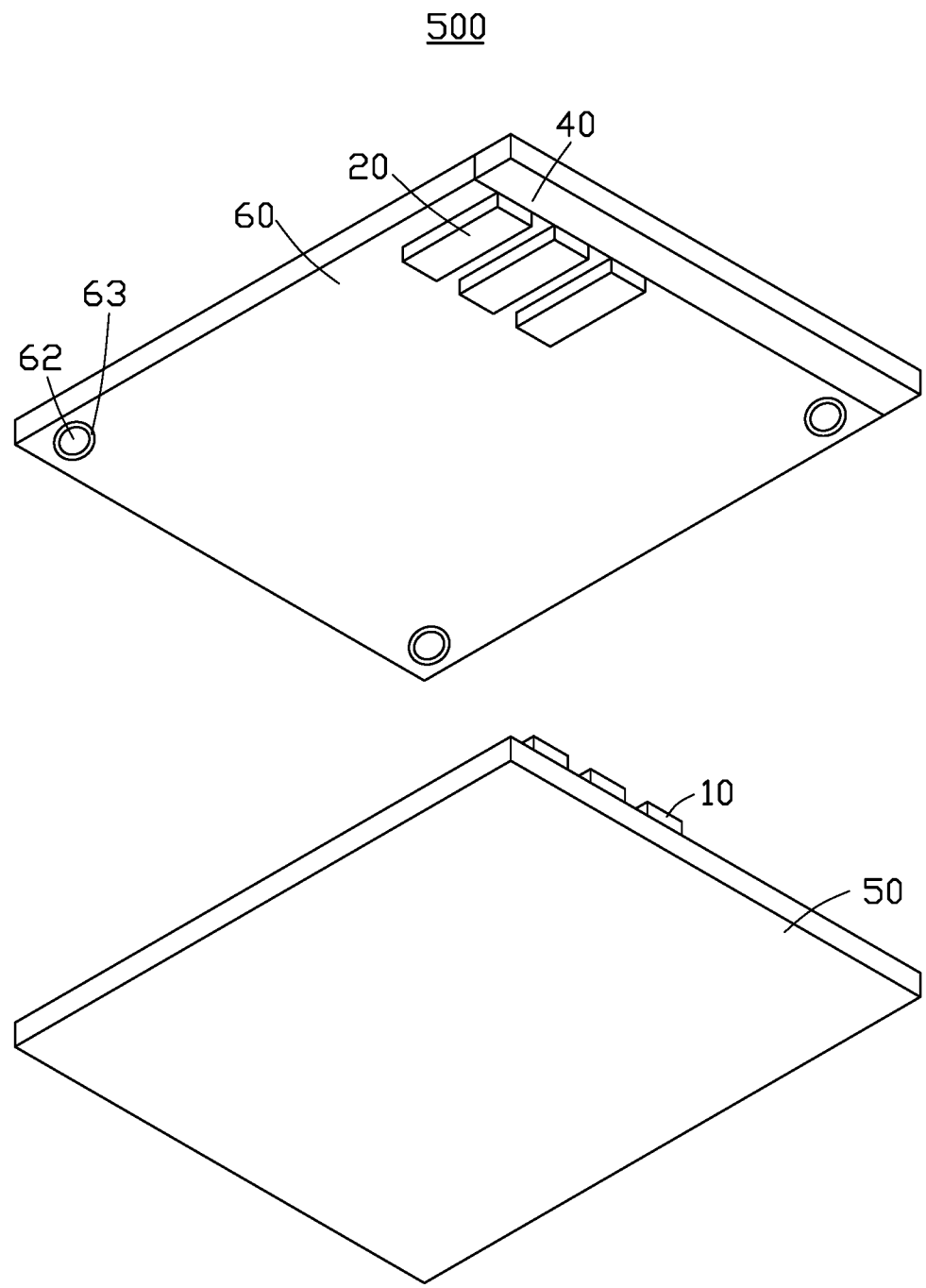
FIG. 8 is an exploded view of a camera module according to a fifth embodiment of the present disclosure.
Figure 9:
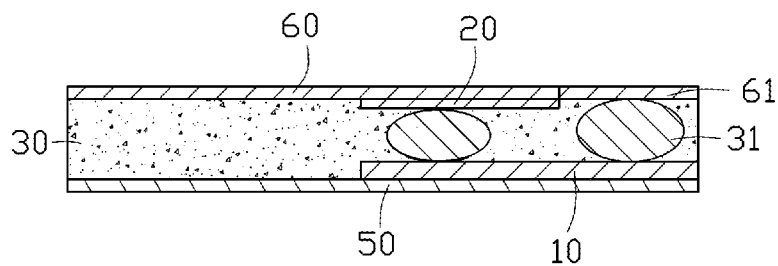
FIG. 9 is a cross section view of the camera module according to the fifth embodiment.

Referring to FIG. 8 and FIG. 9, a camera module 500 is provided. The configuration of the camera module 500 the of the fifth embodiment is same as the camera module 400 of the fourth embodiment, except that the light transmission component 40 is omitted, and the light transmission area 61 plays the same role as the light transmission component 40. Specifically, the connection board 20 is arranged on the FPC 60, the light transmission area 61 and the FPC 60 are located in the same plane, the conductive adhesive 30 is arranged between the connection board 20 and the substrate 10. The conductive adhesive 30 is also arranged between the light transmission area 61 and the substrate 10, and the layer of conductive adhesive 30 between the connection board 20 and the substrate 10 is thicker than that between the light transmission area 61 and the substrate 10. Then the operator can observe the conductive particles 31 between the light transmission area 61 and the substrate 10, according to a principle similar to that of the second embodiment, the conductivity between the connection board 20 and the substrate 10 can be tested in a nondestructive manner.

Embodiment 6

Figure 10:
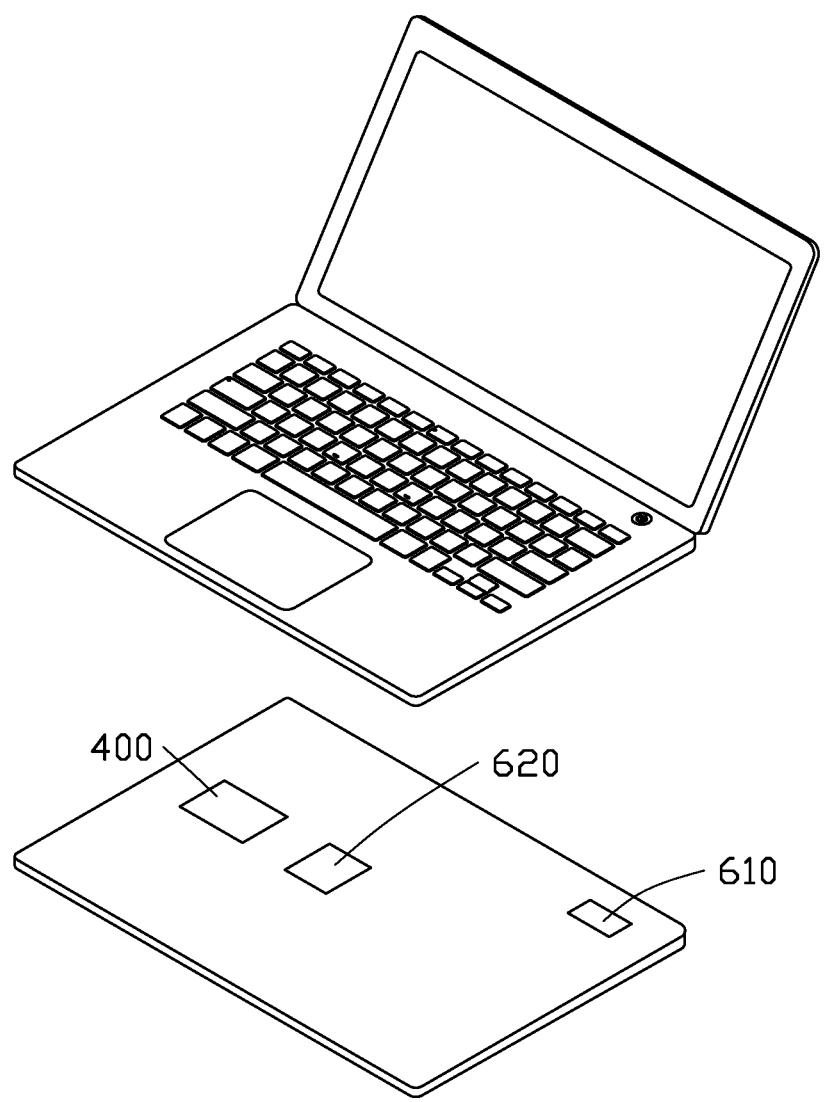
FIG. 10 is an exploded view of an electronic device according to a sixth embodiment of the present disclosure.

Referring to FIG. 10, an electronic device 600 is provided, the electronic device 600 includes the camera module 400 of the fourth embodiment or the camera module 500 of the fifth embodiment. The electronic device 600 can be a laptop. The electronic device 600 may further include a power supply 610, a processor 620, and other components.

While the invention has been described in detail in connection with only a limited number of embodiments, it should be readily understood for the skilled in the art that the invention is not limited to such disclosed embodiments. Rather, the invention can be modified to incorporate any number of variations, alterations, substitutions, or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A connecting assembly, comprising
 a substrate;
 a connection board parallel to the substrate;

a layer of conductive adhesive adhered to the substrate, the connection board is connected to the substrate by the layer of conductive adhesive placed there between, the layer of conductive adhesive comprises multiple conductive particles, electric conductive connections between the connection board and the substrate are established by the multiple conductive particles in the layer of conductive adhesive; and a light transmission component parallel to the substrate, the light transmission component is connected to the substrate by the layer of conductive adhesive adhered to the substrate, wherein the light transmission component is configured for transmitting light, the multiple conductive particles reflect light transmitted to the layer of conductive adhesive out through the light transmission component.

2. The connecting assembly of claim 1, wherein the light transmission component and the connection board are in a same plane.

3. The connecting assembly of claim 2, wherein the light transmission component is connected to the connection board at peripheries of the connection board.

4. The connecting assembly of claim 2, wherein the light transmission component is arranged in a middle part of the connection board.

5. The connecting assembly of claim 4, wherein a cross-sectional area of the light transmission component is a polygon, a circle, or an oval, viewed in a direction perpendicular to the connection board.

6. The connecting assembly of claim 1, wherein the connection board is arranged on a side of the light transmission component away from the substrate.

7. A camera module comprising:
a connecting assembly of claim 1;
a carrier, the substrate of the connecting assembly being mounted on the carrier; and
a flexible printed board, the connection board of the connecting assembly being mounted on the flexible printed board, the flexible printed board comprising a light transmission area configured for transmitting light into the light transmission component of the connecting assembly.

8. The camera module of claim 7, wherein the light transmission component and the connection board are in a same plane.

9. The connecting assembly of claim 8, wherein the light transmission component is connected to the connection board at peripheries of the connection board.

10. The connecting assembly of claim 8, wherein the light transmission component is arranged in a middle part of the connection board.

11. The connecting assembly of claim 10, wherein a cross-sectional area of the light transmission component is a polygon, a circle, or an oval, viewed in a direction perpendicular to the connection board.

12. The connecting assembly of claim 10, wherein the connection board and the light transmission component are parallel to each other.

13. A camera module comprising:
a connecting assembly of claim 1;
a carrier, the substrate of the connecting assembly being mounted on the carrier; and
a flexible printed board, the connection board of the connecting assembly being mounted on the flexible printed board, the light transmission component being connected to the flexible printed board at a periphery of the flexible printed board, and the light transmission component and the flexible printed board are in a same plane.

14. The camera module of claim 7, wherein
the carrier is arranged with multiple first positioning marks, the flexible circuit board is arranged with multiple second positioning marks corresponding to the multiple first positioning marks, the flexible printed board is positioned relative to the carrier by aligning the multiple first positioning marks with the multiple second positioning marks correspondingly.

15. The camera module of claim 14, wherein
the flexible printed board is arranged with multiple light transmission rings, each of the multiple light transmission rings encircles a corresponding one of the multiple second positioning marks.

16. An electronic device comprising a camera module of claim 7.

17. An electronic device comprising a camera module of claim 13.

* * * * *